United States Patent [19]

Wong

[11] Patent Number: 5,200,924
[45] Date of Patent: Apr. 6, 1993

[54] BIT LINE DISCHARGE AND SENSE CIRCUIT

[75] Inventor: Thomas S. W. Wong, Santa Clara County, Calif.

[73] Assignee: Synergy Semiconductor Corporation, Santa Clara, Calif.

[21] Appl. No.: 704,675

[22] Filed: May 21, 1991

Related U.S. Application Data

[63] Continuation of Ser. No. 331,684, Mar. 30, 1989, abandoned.

[51] Int. Cl.⁵ .................. G11C 7/00; G11C 11/414; G11C 11/416
[52] U.S. Cl. .................... 365/208; 365/155; 365/179; 365/190; 365/204; 365/225.6
[58] Field of Search .............. 365/155, 174, 175, 179, 365/190, 225.6, 242, 243, 204; 307/350, 530

[56] References Cited

U.S. PATENT DOCUMENTS

| | | | |
|---|---|---|---|
| 4,090,255 | 5/1978 | Berger et al. | 365/175 |
| 4,322,820 | 3/1982 | Toyoda | 365/157 |
| 4,376,985 | 3/1983 | Isogai | 365/155 |
| 4,456,979 | 6/1987 | Isogai | 365/190 |
| 4,459,686 | 7/1984 | Toyoda | 365/155 |
| 4,641,283 | 2/1987 | Wilhelm | 365/190 |
| 4,665,508 | 5/1987 | Chang | 365/190 |
| 4,712,193 | 12/1987 | Baskett | 365/190 |
| 4,761,766 | 8/1988 | Barre | 365/190 |
| 4,841,484 | 6/1989 | Watanabe et al. | 365/190 |
| 4,845,679 | 7/1989 | Vu | 365/175 |
| 4,864,540 | 9/1989 | Hashemi et al. | 365/190 |

FOREIGN PATENT DOCUMENTS

| | | | |
|---|---|---|---|
| 0216264 | 4/1987 | European Pat. Off. | |
| 0074664 | 4/1984 | Japan | 365/190 |
| 2636690 | 10/1988 | Japan | 365/175 |

Primary Examiner—Joseph L. Dixon
Assistant Examiner—Jack A. Lane
Attorney, Agent, or Firm—Flehr, Hohbach, Test, Albritton & Herbert

[57] ABSTRACT

A bit line discharge and sense circuit is provided for use with a static RAM that includes a row and column array of memory cells addressable via first and second bit lines and also a row select line. Each memory cell includes a transistor pair, wherein the first and second bit lines are coupled to an emitter of a first and second transistor comprising the transistor pair. The invention couples two current sources via the associated bit lines to the emitter of each transistor in the cell. A first current source is coupled when the cell is selected and provides a first current value having a bit line capacitance discharge current component and a first transistor read current component. A second current source is coupled to the same emitter when the cell is selected, and provides a lower current value. The first current source rapidly discharges capacitance associated with the associated bit line on the selected cell. The second, lower magnitude, current source is coupled to each bit line such that only the current difference between the first and second current sources flows through the selected cell. In this fashion the circuit rapidly discharges associated capacitance without subjecting the selected cell to excessive current flow. A voltage differential may be sensed directly via diode followers coupled to the emitter voltages to read the value of the selected memory cell.

14 Claims, 3 Drawing Sheets

BIT LINE DISCHARGE AND SENSE CIRCUIT

This is a continuation of application Ser. No. 07/331,684 filed on Mar. 10, 1989, now abandoned.

FIELD OF THE INVENTION

This invention relates generally to a high-speed static memory array, and more particularly to a discharge and sensing circuit for a static memory array.

BACKGROUND OF THE INVENTION

The classic problem with sensing a bipolar random access memory is the high capacitance present along the bit lines. The total capacitance presented to the bit line is a function of the number of cells along the column to be read. Every cell along the column has at least one emitter tied to the bit line. So if 64 cells are tied to the column line, 64 emitters are tied to that column line. In most static memory cells, the emitter is heavily doped and the base is heavily doped, so that the emitter base capacitance is high. Assuming 64 cells on a column, 63 have reversed biased base-emitter junctions, resulting in very high bit line capacitance. All of this capacitance has to be charged and discharged to sense what is stored in a selected cell.

A static memory cell includes two transistors which have opposite states. Reading the state of a given cell is a function of the sense circuit's ability to sense the voltage difference between bit lines tied to the emitters of the separate transistors which form a single cell. The only way to rapidly charge and discharge the capacitance of the transistors tied to the bit line to sense the cell state is with current; the higher the current the faster rate of charge and discharge.

However, cells classically cannot handle a high level of current. Too much current overloads the cell, so that the cell cannot be sensed or it is extremely difficult to sense. Due to the limitations imposed on the sensing current, one of the greatest sources of delay in bipolar memory arrays is the time required to discharge the bit lines. This may amount to as much as 50% of the total delay in reading a bipolar memory cell.

Therefore, the primary problem addressed by this invention is to provide a circuit arrangement and method for charging and discharging the capacitance tied to the bit lines very fast in order to maximize the speed with which a bipolar memory array can be read.

SUMMARY OF THE INVENTION

In summary, according to this invention, two current sources are used, having a relatively small difference. The larger current source is used to discharge the capacitance on the bit line. However, only the current difference between the two current sources flows through the cell transistor being read. Thus a high current flows in the bit line, but a much lower current in the cell.

Using this arrangement, the voltages on the bases of the two transistors of the cell can be sensed directly, by diodes connected followed to the emitters of the two transistors of the cell. When forward biased, these diodes function as voltage or diode followers in that the voltage at the diode anode follows the voltage at the diode cathodes, and thus follows the cell transistor's emitter voltage, e.g., the bit line voltage. As the base of one transistor will be at a voltage level significantly higher than the sense level, and the base of the other transistor at a voltage level significantly lower, a simply constructed differential sense amplifier connected between the two diode followers which are connected to the emitters of the transistors of the cell will immediately indicate the state of the selected cell.

By adopting this configuration, the classic problem with the fact that the current which is used to charge the bit line capacitance also flows into the memory cell is overcome.

A further problem with the prior art is the delay which results from the inability to sense the bit line directly; that is, in the prior art either a sense transistor or a differential amplifier is used on every column, and the system essentially senses the collector of the sense transistor or the differential amplifier and develops the differential signal at that point. This invention senses the nodes directly to get a direct reading of the voltage at the bit lines without the extra sense transistor or differential amplifier delay.

BRIEF DESCRIPTION OF THE DRAWINGS

The advantages and features of this invention will be better understood with reference to the following figures wherein.

DETAILED DESCRIPTION OF A PREFERRED EMBODIMENT

Figure 1C:
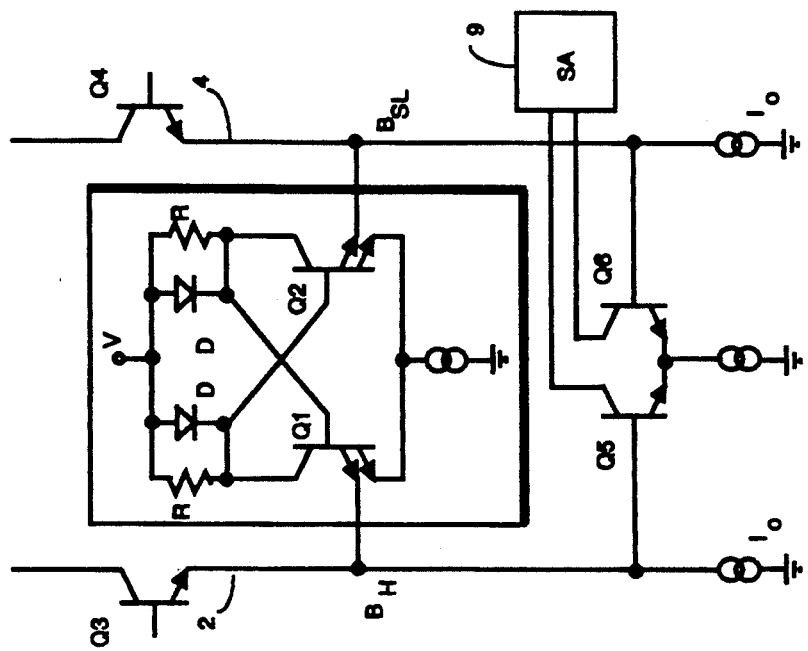
FIG 1A, 1B and 1C illustrate the known and presently applied techniques for reading a cell of a bipolar memory array.
Figure 1B:
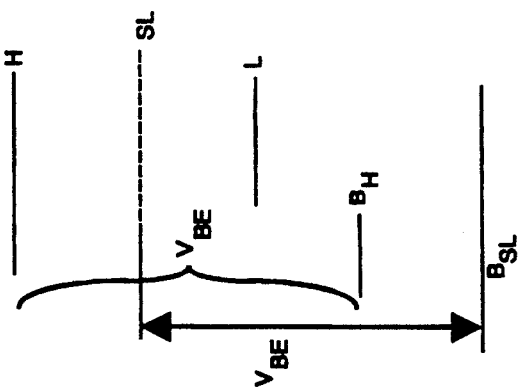
Figure 1A:
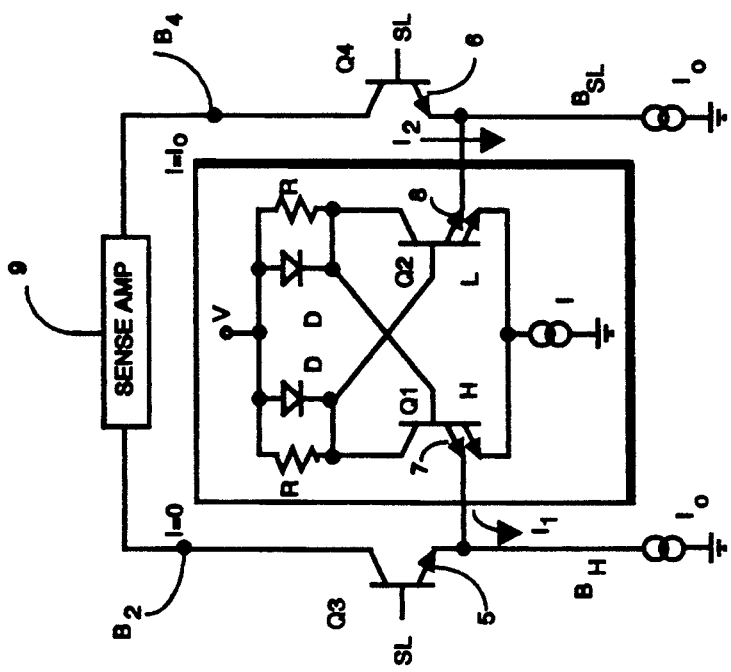

FIGS. 1A and 1B illustrate a typical bipolar static random access memory cell including a pair of cross coupled transistors Q1 and Q2. A pair of sense transistors Q3, Q4 are provided with their emitters 5, 6 connected to the emitters 7, 8 of the cross-coupled transistors Q1, Q2 in the cell.

It is known that at any given time, the voltage level of the base of one of the transistors Q1, Q2 is High (H) and the voltage level of the base of the other of the transistors Q1, Q2 is Low(L); the respective voltage levels are shown in FIG. 1B having higher and lower values respectively than the sense level voltage (SL). Thus, the pair of transistors Q1 and Q3 form a differential amplifier, as do the pair of transistors Q2 and Q4. In accordance with the standard operation of differential amplifiers, the transistor with the higher base voltage level takes all the current, whereas the transistor with the lower base voltage level takes no current. The current flow in this cell construction and with these relative voltage levels, is represented by the arrows $I_1$ and $I_2$.

On the left-hand side of the cell, $I_1$ is equal to $I_0$; on the right-hand side of the cell, $I_2$ is equal to $I_0$. By coupling a sense amplifier 9 between the sense nodes B2 and B4, this sense amplifier 9 can read the difference in the currents and determine the state of the cell.

Alternatively, as in FIG. 1C, the voltage difference in such an arrangement can be sensed, since the voltage on the left-hand bit line 2 would be equal to $B_H$, (i.e., the voltage level H) minus $V_{BE}$; the voltage level on the right-hand bit line 4 would be equal to $B_{SL}$, i.e., voltage level SL minus $V_{BE}$. A differential amplifier, constructed of transistors Q5, Q6, and connected between the two bit lines would read these two voltages, and the output of the differential amplifier is the input to sense amplifier 9. However, as noted above with these structures, $I_0$ is strictly limited because this is the current that flows into the cell transistor which can easily be swamped by excessive current flow. In addition, the electrical signal has to pass through either sense transistors Q3, Q4 or the differential amplifier formed by Q5, Q6 which resulted in additional delay.

As explained in summary above, the objective herein is to maximize $I_0$ in order to rapidly charge and discharge the capacitance tied to the bit lines, and to eliminate extra delay through the critical delay path. In this invention this is achieved by the array shown schematically in FIG. 2 which uses a pair of current sources $I_2$, $I_1$, connected to the sense amplifier with $I_2$ being greater than $I_1$. The difference between the two currents $I_2$, $I_1$, is the net current flow into the transistor $Q_1$ of any selected cell. However, the full current $I_2$ which can be significantly larger than the current $I_0$ used in prior art bipolar memory arrays is available to discharge the bit line capacitance $C_{BIT}$ during bit line switching.

Figure 2:
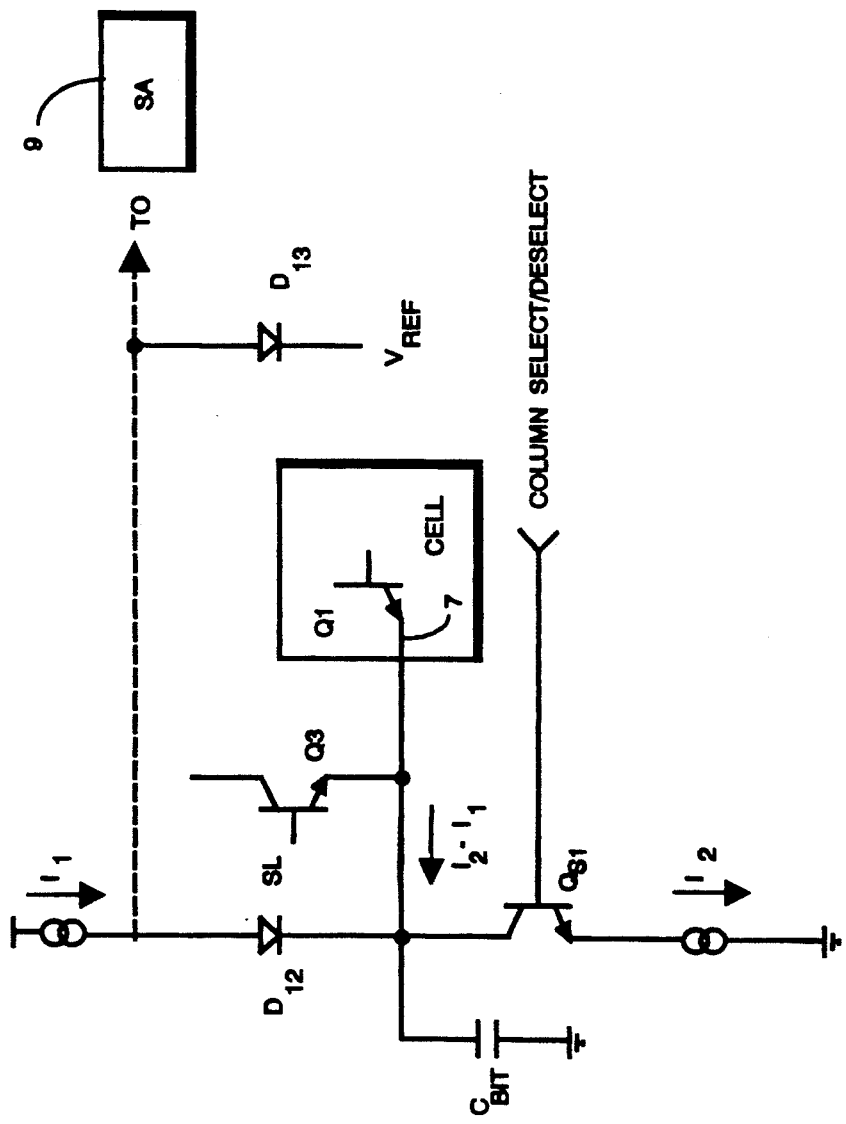
FIG. 2 schematically illustrates the improved cell sensing arrangement of this invention.

In a further distinction from prior art arrangements, a diode D12 is added in series with the smaller current source $I_1$ between that current source and the node connected to the emitter 7 of the cell transistor. The diode D12 is necessary because current flow from current source $I_1$ is desirable only on the column that is active. The diode D12 can be reverse biased by a COLUMN SELECT signal which reverse biases the diode of every column which is not selected during a given read operation. An example of circuitry effective in establishing a reverse bias on the diode D12 by a COLUMN SELECT signal is depicted in FIG. 2 as transistor $Q_{S1}$. In operation, when the column is selected, the transistor $Q_{S1}$ is turned on and the diode D12 is forward biased. Conversely, when the column is not selected, transistor $Q_{S1}$ is turned off. As a result current $I_1$ charges $C_{BIT}$ up to a voltage level causing diode D12 to turn off. Current $I_1$ then can no longer flow through diode D12, but can flow through another forward biased diode associated with a selected column. In addition, in the preferred embodiment of this invention, a diode D13 is added to limit the voltage swing of the sense nodes.

Figure 3:
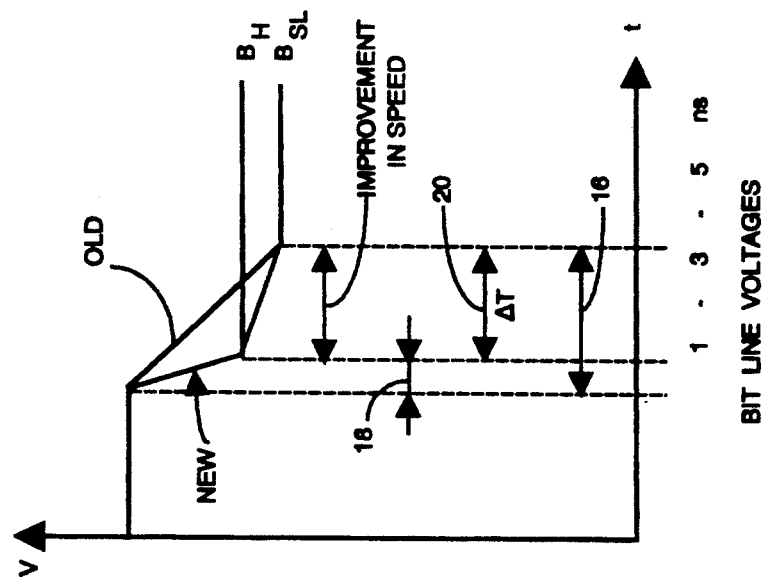
FIG. 3 illustrates the bit line switching characteristics of the array of this invention.

The improvement achieved by this modified design is dramatically illustrated by the timing chart of FIG. 3. In typical bit line switching, an accurate read can be achieved only when the lines B2, B4 (FIG. 1A) stabilize at the voltages represented by $B_H$ and $B_{SL}$. In the graph of FIG. 3, the time required for the voltages on the lines to stabilize sufficiently for the voltage differential to be accurately read by the differential amplifier 9 is represented by the arrow 16; this time lag be on the order of about 5 nanoseconds, as the rate of change of the voltage is linear. To read the voltage difference between the two transistors of a cell, the high voltage level V is removed, allowing the current 10 flow to discharge the capacitance $C_{BIT}$ tied to the bit line and the capacitances on the two sense nodes to stabilize at the indicated values.

The use of the higher level current flow $I_2$ to discharge the capacitors significantly reduces the time delay until the voltage differential can be read. As indicated in FIG. 3, the delay until read can occur is now represented by the arrow 18; the improvement $\Delta T$ is represented by arrow 20. The improvement achieved by this invention can be from 1 to 3 nanoseconds' reduction in switching time.

Figure 4:
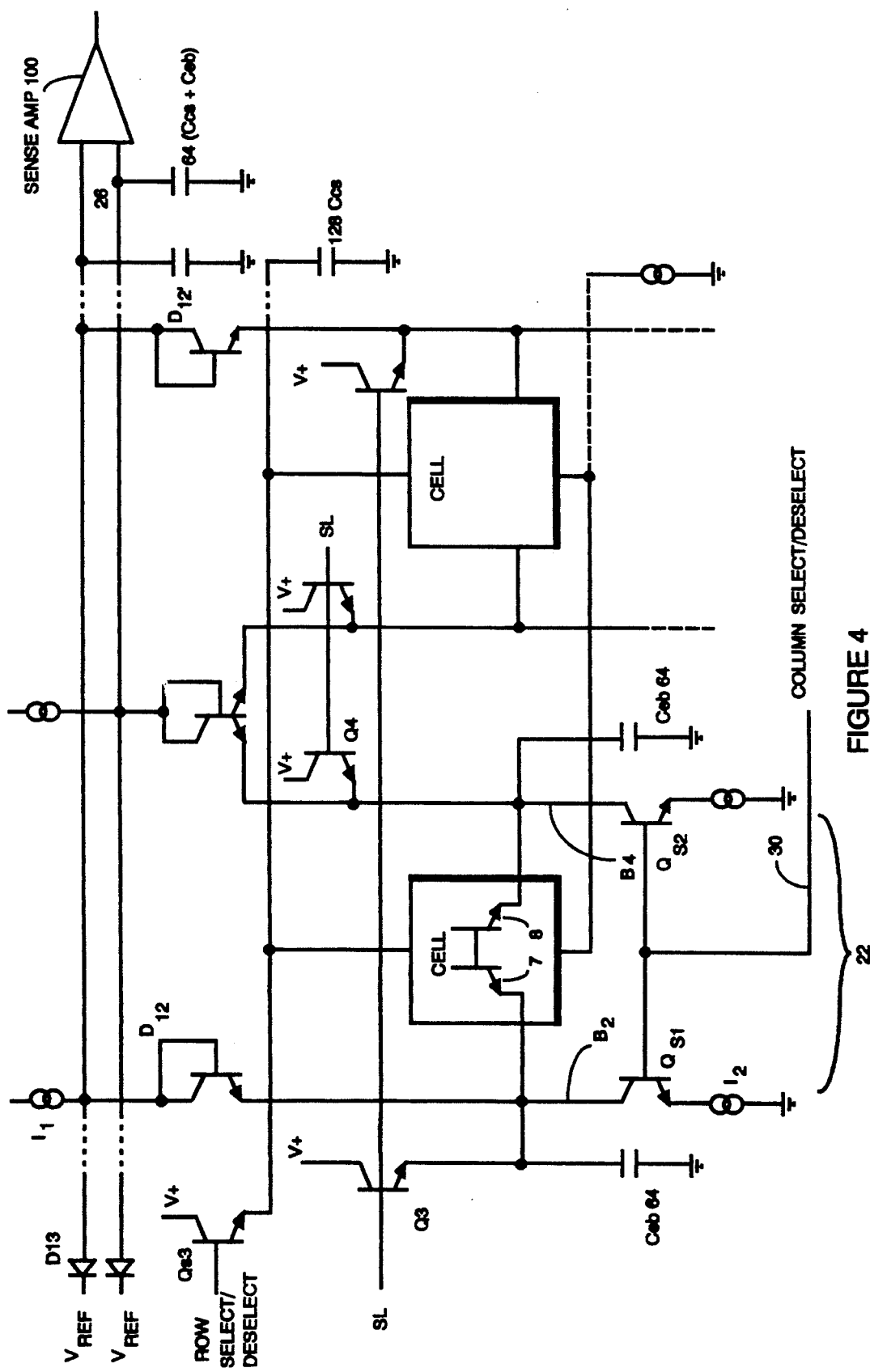
FIG. 4 schematically illustrates a multicell memory array incorporating the improved feature of this invention.

The complete memory array of this invention is shown in FIG. 4 and includes the bit lines B2, B4, a pair of which are connected to every cell in a column 22, and particularly the emitters 7, 8 of transistors Q1, Q2 of each column cell and the word lines 24 one of which is connected to every cell in a row. The column select line activates transistors $Q_{S1}$ and $Q_{S2}$ turning on column 22. A row select/deselect signal is coupled to the base of transistor $Q_{S3}$. Transistor $Q_{S3}$ gates voltage $V^+$, applied at the collector of $Q_{S3}$, to activate row select line 24. The combination of an activated column select line 30 and a row select line 24 will selectively activate a particular cell for reading at any particular time. The capacitances $C_{eb}$ (the emitter base capacitance of the transistors) and $C_{cs}$ (the collector-substrate capacitance of the transistors) are also represented in this figure. The ability to use the large current $I_2$ to charge and discharge these capacitances significantly speeds up the cell read times herein.

The sense amplifier inputs 26 in this invention as can be clearly seen in FIG. 4 are basically directly following the bit lines. As depicted in FIG. 4, each diode D12 may be formed by coupling together the base and collector leads of a bipolar transistor referred to herein as a sense transistor. The resultant diode functions as a diode or voltage follower to give an extremely rapid readout of the relative voltages on the two transistors in the cell. This provides extremely high speeds for reading the cells in the array. Other modifications of this invention may become apparent to a person of skill in the art who studies this invention disclosure. Therefore, the scope of this invention is to be limited only by the following claims.

What is claimed is:

1. An arrangement for sensing the state of a selected cell of an array of static memory cells arranged in rows and columns, each said memory cell comprising first and second bipolar transistors whose different states define the value stored in said selected cell, said arrangement comprising:

a single word line connected to every memory cell in a row of said array;

first and second bit lines, said first bit line coupled to an emitter of said first transistor of every memory cell in a column of said array, said second bit line coupled to an emitter of said second transistor of every memory cell in a column of said array;

means for selecting the selected cell in said array by selective activation of said word and said first and second bit lines;

a first current source coupled to said emitter of said first transistor of said selected cell by said first bit line for providing a first current value, said first current value consisting of a first bit line capacitance discharge current component and a first transistor read current component;

a second current source providing a second current value lower than said first current value supplied by said first current source, said second current source coupled by said first bit line to said emitter of said first transistor of said selected cell;

first diode means series-coupled in said first bit line between said second current source and said emitter of said first transistor of said selected cell;

a third current source coupled to said emitter of said second transistor by said second bit line for providing a third current value, said third current value consisting of a second bit line capacitance discharge current component and a second transistor read current component;

a fourth current source providing a fourth current value lower than said third current value supplied by said third current source, said fourth current source coupled by said second bit line to said emitter of said second transistor of said selected cell;

second diode means series-coupled in said second bit line between said fourth current source and said emitter of said second transistor of said selected cell;

means coupled to said first and second bit lines for selectively reverse biasing said first and second diode means in said bit lines not selected for reading, wherein a non-selected cell is isolated from said second and fourth current sources;

said first current source having said first current value preselected to provide first bit line capacitance discharge within a desired time period, and said second current source having said second current value preselected so that a difference current between said first current value and said second current value, which flows in said first transistor of said selected cell for reading a state of said first transistor, is within a desirable operating range for said first transistor;

said third current source having said third current value preselected to provide second bit line capacitance discharge within a desired time period, and said fourth current source having said fourth current value preselected so that a difference current between said third current value and said fourth current value, which flows in said second transistor of said selected cell for reading a state of said second transistor, is within a desirable operating range for said second transistor; and sense means coupled to said first and second bipolar transistors in said selected cell for sensing the state of said selected cell.

2. An arrangement as in claim 1, including:

first and second sense lines, said first sense line coupled to said first diode means, and said second sense line coupled to said second diode means;

wherein a sense amplifier connected across said first and second sense lines will rapidly read the voltage differential between said first and second transistors of said selected cell.

3. An arrangement as in claim 1, including:

third diode means coupled to said second current source and to a first reference voltage means for limiting the voltage swing of said first transistor emitter in response to said second current source;

fourth diode means coupled to said fourth current source and to a second reference voltage means for limiting the voltage swing of said second transistor emitter in response to said fourth current source.

4. An arrangement as in claim 1, including:

first and second sense lines, said first sense line coupled to said emitter of said first transistor in said selected cell, said second sense line coupled to said emitter of said second transistor in said selected cell; and a sense amplifier connected across said first and second sense lines for rapidly reading the voltage differential between said first and second transistors of said selected cell.

5. An arrangement as in claim 4 including:

third diode means coupled to said second current source and to a first reference voltage means for limiting the voltage swing of said first transmitter emitter in response to said second current source;

fourth diode means coupled to said fourth current source and to a second reference voltage means for limiting the voltage swing of said second transistor emitter in response to said fourth current source.

6. An arrangement for sensing the state of a selected cell of an array of static memory cells arranged in rows and columns, each said memory cell comprising a pair of bipolar transistors whose different states define the value stored in said selected cell, said arrangement comprising:

a single word line connected to every memory cell in a row of said array;

a pair of bit lines, each one of said pair of bit lines coupled to an emitter of one of said transistors in every memory cell in a column of said array;

means for selecting said selected cell in said array by selective activation of said word and said pair of bit lines;

first current source coupled to said emitter of each of said pair of transistors of said selected cell in said array by each of said bit lines for providing a first electrical current value for discharging the capacitance effectively coupled to said pair of bit lines during said selective activation of said bit lines of said array;

a second current source means for providing a second electrical current value lower than said first electrical current value supplied by said first current source means, said second current source means also coupled to each of said emitters of said pair of transistors of said selected cell by each of said bit lines so that only the difference in said first and second current values flows through the transistors in said selected cell;

sense means coupled to said pair of transistors in said selected cell for sensing the state of said selected cell;

first diode means series-coupled in said bit lines between said second current source means and said emitter of each of said pair of transistors of said selected cell;

means coupled to said bit lines for selectively reverse biasing said first diode means in said bit lines not selected for reading to isolate a non-selected cell from said second current source; and second diode means coupled to said second current source means and to a reference voltage mans for limiting the voltage swing of each said transistor emitter in response to said second current source.

7. An arrangement for sensing the state of a selected cell of an array of static memory cells arranged in rows and columns, each said memory cell comprising a pair of bipolar transistors whose different states define the value stored in said selected cell, said arrangement comprising:

a single word line connected to every memory cell in a row of said array;

a pair of bit liens, each one of said pair of bit lines coupled to an emitter of one of said transistors in every memory cell in a column of said array;

means for selecting a selected cell in said array by selective activation of said word and said pair of bit lines;

first current source means coupled to said emitter of each of said pair of transistors of said selected cell in said array by each of said bit lies for providing a first electrical current value for discharging the capacitance effectively coupled to said bit lines during said selective activation of said bit lines of said array;

second current source means providing a second electrical current value lower than said first electrical current value supplied by said first current source means, said second current source means also coupled to each of said emitters of said transistors of said selected cell by each of said bit lines so that only the difference in said first and second current values flows through said selected transistors;

sense means coupled to said pair of transistors in said selected cell for sensing the state of said selected cell;

first diode means series-coupled in said bit lines between said second current source means and said emitter of each of said pair of transistors of said selected cell;

means coupled to said bit lines for selectively reverse biasing said first diode means in said bit lines not selected for reading to isolate a non-selected cell from said second current source means;

a pair of sense lines, each of said pair of sense lines coupled to one of said transistors in said selected cell; and a sense amplifier connected across said pair of sense lines for rapidly reading the voltage differential between said two transistors of said selected cell.

8. An arrangement as in claim 7, including second diode means coupled to said second current source means and to a reference voltage means for limiting the voltage swing of said transistor emitter in response to said second current source means.

9. An arrangement for sensing the state of a selected cell of an array of static memory cells arranged in rows and columns, each said memory cell comprising a pair of bipolar transistors whose different states define the value stored in said selected cell, said arrangement comprising:

a single word line connected to every memory cell in a row of said array;

a pair of bit lines, each one of said pair of bit lines coupled to an emitter of one of said transistors in every memory cell in a column of said array;

means for selecting the selected cell in said array by selective activation of said word and said pair of bit lines;

first current source means coupled to said emitter of each of said pair of transistors of said selected cell in said array by each of said bit lines for providing a first electrical current value for discharging the capacitance effectively coupled to said bit lines during said selective activation of said bit lines of said array;

second current source means for providing a second electrical current value lower than said first electrical current value supplied by said first current source means, said second current source means also coupled to each of said emitters of said transistors of said selected cell by each of said bit lines so that only the difference in said first and second current values flows through said selected transistors;

first diode means series-coupled in said bit lines between said second current source means and said emitter of each of said transistor of said selected cell;

means for reverse biasing said first diode means, coupled to said bit lines for selectively reverse biasing said first diode means in said bit lines not selected for reading wherein a non-selected cell is isolated from said second current source means; and sense means including a differential amplifier coupled to said emitters of said pair of transistors in said selected cell for directly sensing voltage on the bases of said pair of transistors for sensing the state of said selected cell.

10. An arrangement as in claim 9, including a pair of sense lines, each of said pair of sense lines coupled to one of said emitters of said transistors in said selected cell; and a sense amplifier connected across said pair of sense lines for rapidly reading the voltage differential between said two transistors of said selected cell.

11. An arrangement as in claim 9, including second diode means coupled to said second current source means and to a reference voltage means for limiting the voltage swing of said transistor emitters in response to said current source.

12. An arrangement for sensing the state of a selected cell of an array of static memory cells arranged in rows and columns, each said memory cell comprising a pair of bipolar transistors whose different states define the value stored in said selected cell, said arrangement comprising:

a single word line connected to every memory cell in a row of said array;

a pair of bit lines, each one of said pair of bit lines coupled to an emitter of one of said transistors in every memory cell in a column of said array;

means for selecting said selected cell in said array by selective activation of said word and said pair of bit lines;

first current source coupled to said emitter of each of said pair of transistors of said selected cell in said array by each of said bit lines for providing a first electrical current value for discharging the capacitance effectively coupled to said pair of bit lines during said selective activation of said bit lines of said array;

second current source means for providing a second electrical current value lower than said first electrical current value supplied by said first current source means, said second current source means also coupled to each of said emitters of said transistors of said selected cell by each of said bit lines so that only the difference in said first and second values flows through said selected transistors;

sense means coupled to said emitters of said pair of transistors in said selected cell for directly sensing voltage on the bases of said pair of transistors for sensing the state of said selected cell;

first diode means series-coupled in said bit lines between said current source means and said emitter of each transistor of the selected cell; and means for reverse biasing said first diode means, coupled to said bit lines for selectively reverse biasing said first diode means in said bit lines not selected for reading wherein a non-selected cell is isolated from said second current source means.

13. An arrangement for sensing the state of a selected cell of an array of static memory cells arranged in rows and columns, each said memory cell comprising first and second bipolar transistors whose different states define the value stored in said selected cell, said arrangement comprising:

a single word line connected to every memory cell in a row of said array; first and second bit lines, said first bit line coupled to an emitter of said first transistor of every memory cell in a column of said array, said second bit line coupled to an emitter of said second transistor of every memory cell in a column of said array;

means for selecting the selected cell in said array by selective activation of said word and said first and second bit lines;

a first current source coupled to said emitter of said first transistor of said selected cell by said first bit line for providing a first current value, said first current value consisting of a first bit line capacitance discharge current component and a first transistor read current component;

a second current source providing a second current value lower than said first current value supplied by said first current source, said second current source coupled by said first bit line to said emitter of said first transistor of said selected cell;

first diode means series-coupled in said first bit line between said second current source and said emitter of said first transistor of said selected cell;

a third current source coupled to said emitter of said second transistor by said second bit line for providing a third current value, said third current value consisting of a second bit line capacitance discharge current component and a second transistor read current component;

a fourth current source providing a fourth current value lower than said third current value supplied by said third current source, said fourth current source coupled by said second bit line to said emitter of said second transistor of said selected cell;

second diode means series-coupled in said second bit line between said fourth current source and said emitter of said second transistor of said selected cell;

means coupled to said first and second bit lines for selectively reverse biasing said first and second diode means in said bit lines not selected for reading, wherein a non-selected cell is isolated from said second and fourth current sources;

said first current source having said first current value preselected to provide first bit line capacitance discharge within a desired time period, and said second current source having said second current value preselected so that a difference current between said first current value and said second current value, which flows in said first transistor of said selected cell for reading a state of said first transistor, is within a desirable operating range for said first transistor;

said third current source having said third current value preselected to provide second bit line capacitance discharge within a desired time period, and said fourth current source having said fourth current value preselected so that a difference current between said third current value and said fourth current value, which flows in said second transistor of said selected cell for reading a state of said second transistor, is within a desirable operating range for said second transistor; and sense means coupled to said first and second bipolar transistors in said selected cell for sensing the state of said selected cell, wherein said sense means comprises a differential amplifier coupled to said emitters of said pair of transistors in said selected cell for directly sensing voltage on the bases of said pair of transistors.

14. An arrangement as in claim 13 including:

third diode means coupled to said second current source and to a first reference voltage means for limiting the voltage swing of said first transistor emitter in response to said second current source;

fourth diode means coupled to said fourth current source and to a second reference voltage means for limiting the voltage swing of said second transistor emitter in response to said fourth current source.

* * * * *